(12) United States Patent
Jang et al.

(10) Patent No.: US 8,263,857 B2
(45) Date of Patent: Sep. 11, 2012

(54) SOLAR CELL

(75) Inventors: Daehee Jang, Seoul (KR); Jihoon Ko, Seoul (KR); Juwan Kang, Seoul (KR); Jonghwan Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 61 days.

(21) Appl. No.: 12/691,593

(22) Filed: Jan. 21, 2010

(65) Prior Publication Data
US 2011/0041906 A1    Feb. 24, 2011

(30) Foreign Application Priority Data
Aug. 18, 2009  (KR) ................. 10-2009-0076226

(51) Int. Cl.
*H01L 31/00* (2006.01)
(52) U.S. Cl. .......... 136/256; 136/252; 438/78; 438/80; 438/82; 438/93
(58) Field of Classification Search ............. 136/256, 136/252; 438/78, 80, 82, 93
See application file for complete search history.

(56) References Cited

U.S. PATENT DOCUMENTS

| | | | | |
|---|---|---|---|---|
| 4,838,952 A | * | 6/1989 | Dill et al. ............. | 136/256 |
| 6,175,141 B1 | * | 1/2001 | Hofbauer et al. ....... | 257/444 |
| 6,384,317 B1 | * | 5/2002 | Kerschaver et al. ..... | 136/256 |
| 7,144,751 B2 | * | 12/2006 | Gee et al. ............ | 438/98 |
| 7,544,973 B2 | * | 6/2009 | Wada ................. | 257/98 |
| 2007/0186971 A1 | | 8/2007 | Lochun et al. | |
| 2007/0235075 A1 | | 10/2007 | Park | |
| 2009/0272419 A1 | * | 11/2009 | Sakamoto et al. ....... | 136/244 |

FOREIGN PATENT DOCUMENTS

| | | |
|---|---|---|
| JP | 8-191152 A | 7/1996 |
| JP | 2001-345461 A | 12/2001 |
| JP | 2007-281447 A | 10/2007 |
| KR | 10-2004-0017183 A | 2/2004 |
| KR | 10-2005-0035734 A | 4/2005 |
| KR | 10-2008-0032866 A | 4/2008 |

* cited by examiner

*Primary Examiner* — Jennifer Michener
*Assistant Examiner* — Matthew Martin
(74) *Attorney, Agent, or Firm* — Birch, Stewart, Kolasch & Birch, LLP

(57) ABSTRACT

A solar cell includes a substrate of a first conductive type having at least one via hole; an emitter layer of a second conductive type opposite to the first conductive type; and at least one first electrode positioned from a first surface of the substrate to the at least one via hole, and at least one first electrode current collector positioned from the at least one via hole to a second surface of the substrate, wherein the at least one via hole has a radius of about 10 μm to about 40 μm, and at least one of a portion of the at least one first electrode and a portion of the at least one electrode current collector, in the at least one via hole, includes at least one cavity.

9 Claims, 6 Drawing Sheets

| Radius of a viahole (μm) | FF reduction (%) | Sectional area of a first charge transfer unit (μm$^2$) |
|---|---|---|
| 2 | 0.54750% | 12.6 |
| 2.5 | 0.35061% | 19.6 |
| 5 | 0.08772% | 78.5 |
| 10 | 0.02194% | 314.2 |
| 15 | 0.00975% | 706.9 |
| 20 | 0.00548% | 1256.6 |
| 25 | 0.00351% | 1963.5 |
| 30 | 0.00244% | 2827.4 |
| 35 | 0.00179% | 3848.5 |
| 40 | 0.00137% | 5026.5 |
| 45 | 0.00108% | 6361.7 |
| 50 | 0.00088% | 7854.0 |
| 55 | 0.00073% | 9503.3 |
| 60 | 0.00061% | 11309.7 |

SOLAR CELL

CROSS-REFERENCE TO RELATED APPLICATION

This application claims priority to and the benefit of Korean Patent Application No. 10-2009-0076226 filed in the Korean Intellectual Property Office on Aug. 18, 2009, the entire contents of which are incorporated herein by reference.

BACKGROUND OF THE INVENTION (a) Field of the Invention
Embodiments relates to a solar cell.
(b) Description of the Related Art
Recently, as existing energy sources, such as petroleum and coal, are expected to be depleted, interests in alternative energy sources for replacing the existing energy sources are increasing. Among the alternative energy sources, solar cells have been particularly spotlighted because, as cells for generating electric energy from solar energy, the solar cells are able to draw energy from an abundant source and do not cause environmental pollution.

A general solar cell includes a substrate and an emitter layer, formed of a semiconductor, each having a different conductive type, such as a p-type and an n-type, and electrodes respectively formed on the substrate and the emitter layer. The general solar cell also includes a p-n junction formed at an interface between the substrate and the emitter layer.

When light is incident on the solar cell, a plurality of electron-hole pairs are generated in the semiconductor. Each of the electron-hole pairs is separated into electrons and holes by the photovoltaic effect. Thus, the separated electrons move to the n-type semiconductor (e.g., the emitter layer) and the separated holes move to the p-type semiconductor (e.g., the substrate), and then the electrons and holes are collected by the electrodes electrically connected to the emitter layer and the substrate, respectively. The electrodes are connected to each other using electric wires to thereby obtain an electric power.

At least one current collector is positioned on each of the emitter layer and the substrate, and the current collector on the emitter layer and the current collector on the substrate are electrically connected to the corresponding electrodes, respectively. Hence, charges collected by the electrodes move to a load connected to the outside through the current collector adjacent to the electrodes.

However, in this case, because the current collectors are respectively formed on one surface of the substrate on which the light is not incident and the other surface of the substrate on which the light is incident (i.e., the emitter layer on an incident surface of the substrate), an incident area of the light is reduced. Hence, the efficiency of the solar cell is reduced.

Accordingly, a metal wrap through (MWT) solar cell and a back contact solar cell, etc., have been developed so as to decrease or prevent a reduction in the efficiency of the solar cell resulting from the current collectors blocking the light. In the MWT solar cell, a current collector connected to an emitter layer is positioned on a rear surface of a substrate opposite an incident surface of the substrate, and in the back contact solar cell, the electrodes collecting the electrons and the holes are positioned on the rear surface of the substrate.

SUMMARY OF THE INVENTION

According to an aspect of the present invention, a solar cell includes a substrate of a first conductive type having at least one via hole; an emitter layer of a second conductive type opposite to the first conductive type; and at least one first electrode positioned from a first surface of the substrate to the at least one via hole, and at least one first electrode current collector positioned from the at least one via hole to a second surface of the substrate, wherein the at least one via hole has a radius of about 10 $\mu$m to about 40 $\mu$m, and at least one of a portion of the at least one first electrode and a portion of the at least one electrode current collector, in the at least one via hole, includes at least one cavity.

According to another aspect of the present invention, a solar cell includes a substrate of a first conductive type having at least one via hole; an emitter layer of a second conductive type opposite the first conductive type; at least one first electrode positioned on a front surface of the substrate and electrically connected to the emitter layer; at least one first electrode current collector positioned on a rear surface of the substrate and electrically connected to the at least one first electrode through the at least one via hole; and a second electrode electrically connected to the substrate, wherein at least one of the at least one first electrode and the at least one first electrode current collector is extended in the at least one via hole, and thereby electrically connected in the at least one via hole, and the at least one via hole has a radius of about 10 $\mu$m to about 40 $\mu$m.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings

FIG. 5 shows a table numerically expressing the graph of FIG. 4; and

DETAILED DESCRIPTION OF THE EMBODIMENTS

Figure 1:
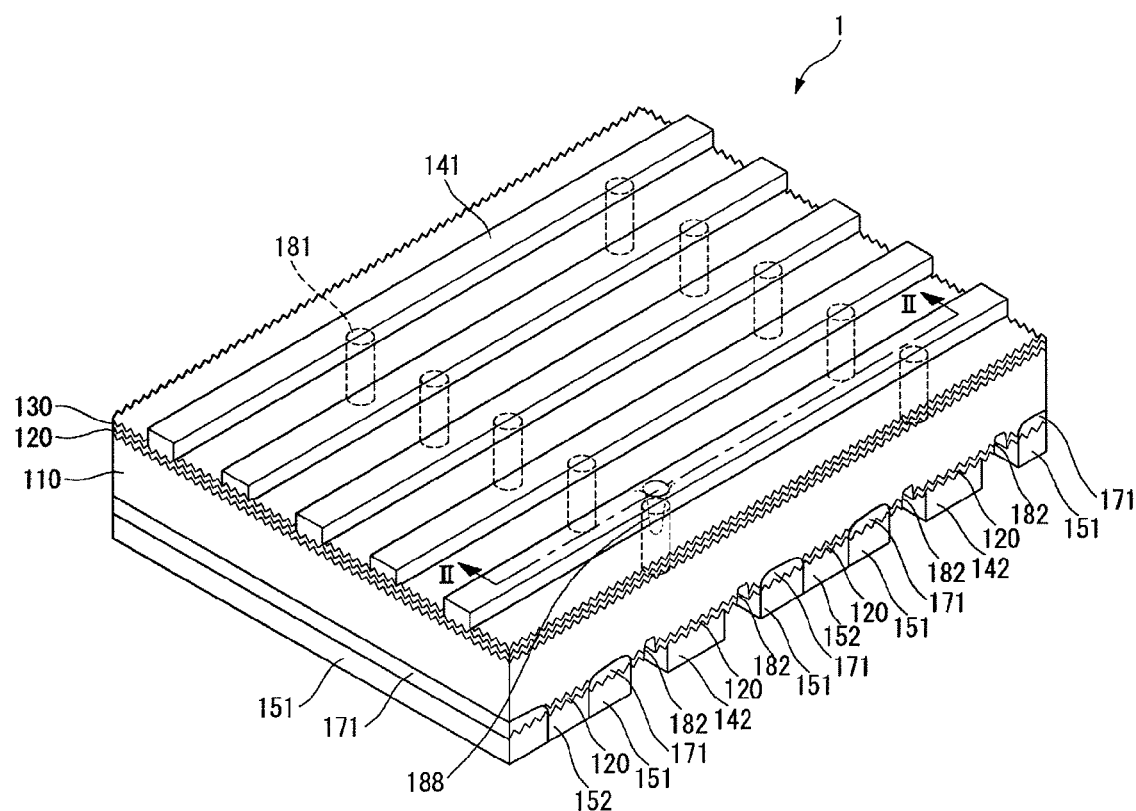
FIG. 1 is a partial perspective view of a solar cell according to an example embodiment of the present invention.

The invention will be described more fully hereinafter with reference to the accompanying drawings, in which example embodiments of the inventions are shown. This invention may, however, be embodied in many different forms and should not be construed as limited to the embodiments set forth herein In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 2:
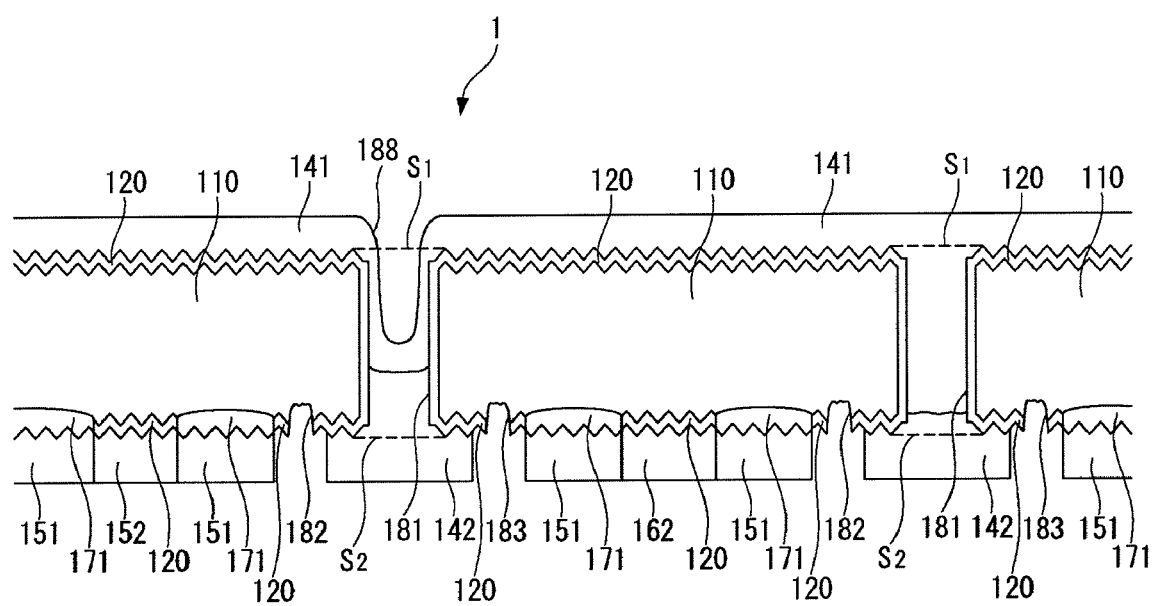
FIG. 2 is a cross-sectional view taken along the line II-II of FIG. 1.
Figure 3:
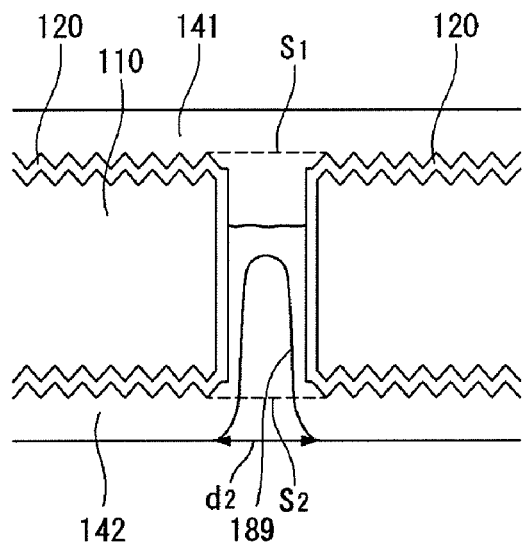
FIG. 3 shows examples of various shapes of portions of a first charge transfer unit disposed in an inner space of a via hole according to example embodiments of the present invention.
Figure 3:
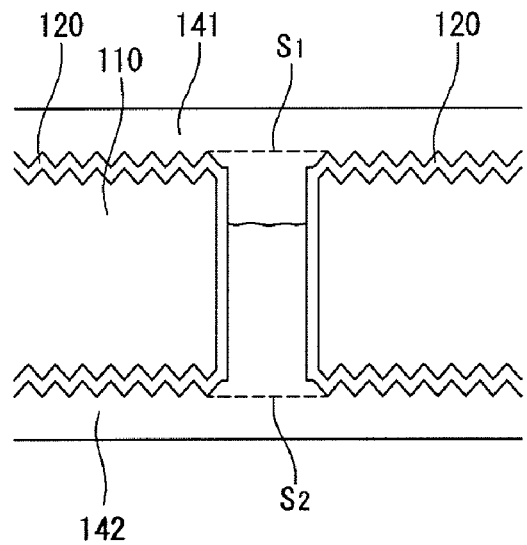
Figure 3:
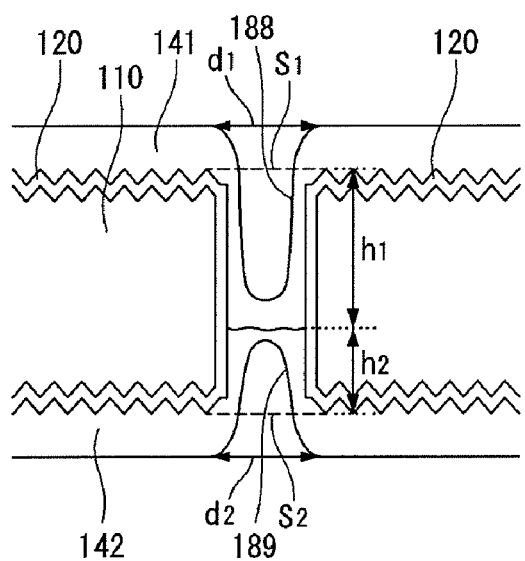
Figure 3:
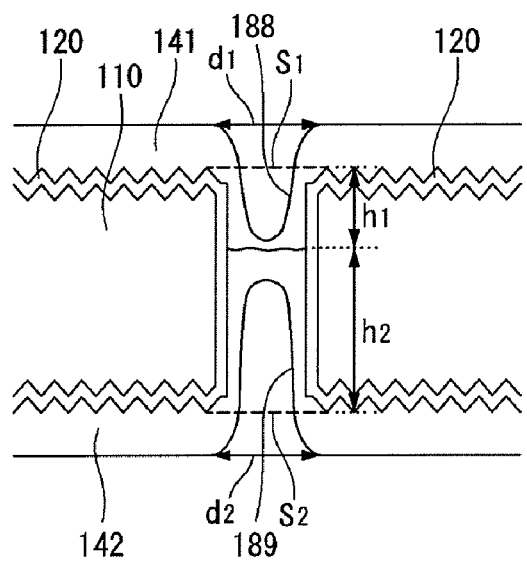

Next, a solar cell according to an example embodiment of the present invention will be described with reference to FIGS. 1 to 3. FIG. 1 is a partial perspective view of a solar cell according to an example embodiment of the present invention, FIG. 2 is a cross-sectional view taken along the line II-II of FIG. 1, and FIG. 3 shows examples of various shapes of portions of a first charge transfer unit disposed in an inner space of a via hole according to example embodiments of the present invention.

As shown in FIG. 1, a solar cell 1 according to an example embodiment includes a substrate 110, an emitter layer 120 positioned on the substrate 110, an anti-reflection layer 130 positioned on the emitter layer 120 on an incident surface (hereinafter, referred to as "a front surface") of the substrate 110 on which light is incident, a plurality of first charge transfer units that include a plurality of front electrodes 141 and a plurality of current collectors 142 for the front electrodes 141, and the plurality of first charge transfer units being electrically connected to the emitter layer 120, a plurality of second charge transfer units that include at least one rear electrode 151 and a plurality of current collectors 152 for the rear electrode 151, the plurality of second charge transfer units being positioned on a rear surface opposite to the front surface of the substrate 110, on which the light is not incident, and at least one back surface field (BSF) 171.

In the example embodiment, the substrate 110 may be formed of silicon doped with an impurity of a first conductive type, for example, a p-type, though not required. Examples of silicon include single crystal silicon, microcrystalline silicon, polycrystalline silicon, and amorphous silicon. When the substrate 110 is of a p-type, the substrate 110 includes an impurity of a group III element such as boron (B), gallium (Ga), and Indium (In). Alternatively, the substrate 110 may be of an n-type, and/or be formed of materials other than silicon. When the substrate 110 is of the n-type, the substrate 110 may include an impurity of a group V element such as phosphor (P), arsenic (As), and antimony (Sb).

The substrate 110 includes a plurality of via holes 181. The via holes 181 penetrate the substrate 110 from a first surface to a second surface of the substrate. The surface of the substrate 110 is textured to form a textured surface, which is an uneven surface, or has uneven characteristics. In this embodiment, a radius of each via hole 181 is about 10 μm or more. In embodiments of the invention, the radius of each via hole 181 may be about 10 μm to about 40 μm.

The emitter layer 120 is an impurity portion having a second conductive type (for example, an n-type) opposite to the first conductive type of the substrate 110. The emitter layer 120 and the substrate 110 form a p-n junction.

A plurality of electron-hole pairs produced by light incident on the substrate 110 is separated into electrons and holes by a built-in potential difference resulting from the p-n junction. Then, the separated electrons move toward the n-type semiconductor, and the separated holes move toward the p-type semiconductor. Thus, when the substrate 110 is of the p-type and the emitter layer 120 is of the n-type, the separated holes and the separated electrons move toward the substrate 110 and the emitter layer 120, respectively. Accordingly, the holes in the substrate 110 and the electrons in the emitter layer 120 become major carriers, in the substrate 110 and the emitter layer 120, respectively.

Because the substrate 110 and the emitter layer 120 form the p-n junction, the emitter layer 120 may be of the p-type when the substrate 110 is of the n-type, unlike the embodiment described above. In this case, the separated electrons and the separated holes move toward the substrate 110 and the emitter layer 120, respectively.

Returning to the embodiment when the emitter layer 120 is of the n-type, the emitter layer 120 may be formed by doping the substrate 110 with an impurity of a group V element, such as P, As, and Sb. On the contrary, when the emitter layer 120 is of the p-type, the emitter layer 120 may be formed by doping the substrate 110 with an impurity of a group III element, such as B, Ga, and In.

The anti-reflection layer 130 formed of silicon nitride ($SiN_X$) and/or silicon oxide ($SiO_X$) is positioned on the emitter layer 120 formed on the front surface of the substrate 110. The anti-reflection layer 130 reduces a reflectance of light incident on the substrate 110 and increases a selectivity of a predetermined wavelength band, thereby increasing the efficiency of the solar cell 1. The anti-reflection layer 130 may have a single-layered structure or a multi-layered structure such as a double-layered structure, and may be omitted, if desired.

In embodiments of the invention, the anti-reflection layer 130 and the emitter layer 120 each have an exposed portion which exposes a portion of an edge of the front surface of the substrate 110. Accordingly, the emitter layer 120 formed on the front surface of the substrate 110 is electrically separated from the emitter layer 120 formed on the rear surface of the substrate 110 by the exposed portion.

The first charge transfer units include the plurality of front electrodes 141 and the plurality of current collectors 142 for the front electrodes 141 (hereinafter, referred to as "a plurality of front electrode current collectors"). The plurality of front electrodes 141 are positioned on the front surface of the substrate 110 and the plurality of front electrode current collectors 142 are positioned on the rear surface of the substrate 110.

The plurality of front electrodes 141 are mainly positioned on the emitter layer 120, which is formed on the front surface of the substrate 110, and are electrically connected to the emitter layer 120. Herein, the anti-reflection layer 130 is not formed between the emitter layer 120 and the front electrodes 141.

The plurality of front electrodes 141 are separated from each other, extends substantially in a predetermined direction, and is substantially parallel to each other. At this time, each front electrode 141 extends on or over at least one via hole 181, and thereby, portions of the front electrode 141 include at least one groove or cavity 188 which is depressed or formed into the via hole 181.

Each front electrode 141 collects charges (for example, electrons) moving to the emitter layer 120. The plurality of front electrodes 141 are formed of at least one conductive metal material. An example of the conductive metal material is at least one selected from the group consisting of nickel (Ni), copper (Cu), silver (Ag), aluminum (Al), tin (Sn), zinc (Zn), indium (In), titanium (Ti), gold (Au), and a combination thereof. Other conductive metal materials may be used.

The plurality of front electrode current collectors 142 are mainly positioned on the emitter layer 120 that is positioned on the rear surface of the substrate 110 near the via holes 181 and are electrically connected to the plurality of front electrodes 141. The plurality of front electrode current collectors 142 are referred to as bus bars, and are spaced apart from each other. The plurality of front electrode current collectors 142 also extends in a direction crossing the front electrodes 141 that are positioned on the front surface of the substrate 110, and is substantially parallel to each other. Thereby, the plurality of via holes 181 is formed in portions of the substrate 110, in which the front electrodes 141 cross the front electrode current collectors 142 on parallel planes or surfaces of the substrate 110.

Since the plurality of front electrode current collectors 142 are electrically connected to the front electrodes 141, the plurality of front electrode current collectors 142 outputs charges (for example, electrons) collected by the front electrodes 141 to an external device.

The plurality of front electrode current collectors 142 are made of at least one conductive material. Examples of the conductive material may be at least one selected from the group consisting of Ni, Cu, Ag, Al, Sn, Zn, In, Ti, Au, and a combination thereof. In an alternative embodiment, other conductive materials may be used for the front electrode current collectors 142.

When at least one of the front electrodes 141 and the front electrode current collectors 142 are positioned in the via holes 181 that has the front electrodes 141 and the front electrode current collectors 142 connected therein, at least one of the front electrodes 141 and the front electrode current collectors 142 is positioned on side walls of the via holes 181 without disconnected portions. In other words, a portion of the front electrodes 141, a portion of the front electrode current collectors 142, or both, is located within the via hole 181.

In addition, when the at least one of portion of the front electrodes 141 and the portion of the front electrode current collectors 142 is positioned on the side walls of the via holes 181, then the at least one of the portion of the front electrodes 141 and the portion of the front electrode current collectors 142 that is positioned on the side walls of the via holes 181 is then continuously connected to the front electrodes 141 on the front surface and to the front electrode current collectors 142 on the rear surface. In other words, the portion of the front electrodes 141 and/or the portion of the front electrode current collectors 142, that is formed on the side walls of the via holes 181, acts as a connection between the front electrodes 141 disposed on the front surface and the front electrode current collectors 142 disposed on the rear surface. Accordingly, the movement of the charges from the front electrodes 141 to the front electrode current collectors 142 through the side walls of the via holes 181 (or the portion of the front electrodes 141 and/or the portion of the front electrode current collectors 142 that is formed on the side walls of the via holes 181) proceeds smoothly.

The second charge transfer units 150 include the at least one rear electrode 151 and the plurality of current collectors 152 for the rear electrode 151 (hereinafter, referred to as "a plurality of rear electrode current collectors). The rear electrode 151 is positioned on the rear surface of the substrate 110. The rear electrode current collectors 152 are electrically connected to the rear electrode 151.

The rear electrode 151 is electrically connected to the substrate 110 and spaced apart from adjacent front electrode current collectors 142. The rear electrode 151 collects charges (for example, holes) moving to the substrate 110. The rear electrode 151 is formed of at least one conductive material. More specifically, the rear electrode 151 may be formed of at least one selected from the group consisting of Ni, Cu, Ag, Al, Sn, Zn, In, Ti, Au, and a combination thereof. Other conductive materials may be used The emitter layer 120 formed between the rear electrode 151 and the front electrode current collectors 142 includes a plurality of exposed portions 182 to expose portions of the rear surface of the substrate 110. The exposed portions 182 cut off an electrical connection between the front electrode current collectors 142 transferring electrons or holes, and the rear electrode 151 collecting the holes or the electrons, and thus, a smooth movement of the electrons and the holes can be achieved or obtained.

Each of the rear surface current collectors 152 may include a plurality of conductors disposed in a predetermined interval and be substantially parallel to the front electrode current collectors 142. At this time, each conductor may have various shapes, such as a circular shape, an oval shape, or a polygonal shape, but is not limited thereto. In an alternative embodiment, the plurality of rear electrode current collectors 152 may be spaced apart from each other and have a stripe shape extending substantially parallel to the front electrode current collectors 142. The plurality of rear electrode current collectors 152 output charges (for example, holes) transferred from the rear electrode 151 to an external device.

In an alternative embodiment different from that shown in FIGS. 1 and 2, the plurality of rear electrode current collectors 152 may overlap portions of the rear electrode 151, to enlarge contact areas between the rear electrode 151 and the rear electrode current collectors 152. Thereby, the charge transfer efficiency between the rear electrode 151 and the rear electrode current collectors 152 is improved.

The rear electrode current collectors 152 are formed of at least one conductive material selected from the group consisting of Ni, Cu, Ag, Al, Sn, Zn, In, Ti, Au, and a combination thereof. Other conductive materials may be used for the rear electrode current collectors 152.

In FIGS. 1 and 2, portions of the emitter layer 120 exist on the rear electrode current collectors 152, but embodiments of the present invention are not limited thereto. In the embodiment shown in FIGS. 1 and 2, the number of front electrode current collectors 142 and rear electrode current collectors 152 may be two or more, respectively, but the numbers thereof may be changed as desired.

Thereby, when the front electrodes 141 positioned on the front surface of the substrate 110 are connected to the front electrode current collectors 142 positioned on the rear surface of the substrate 110 through the via holes 181, as shown in FIGS. 2 and 3, at least one portion of an inner space of each via hole 181 is filled with a portion of the front electrodes 141 and/or a portion of the front electrode current collector 142, such that the portion of the front electrode 141 and/or the portion of the front electrode current collector 142 have various shapes. In this embodiment, the inner space of each via hole 181 refers to a space formed between a virtual upper surface S1 indicated by a virtual surface at an entrance of the via hole 181 positioned on the front surface of the substrate 110 and a virtual lower surface S2 indicated by a virtual surface at an entrance of the via hole 181 positioned on the rear surface of the substrate 110. However, the definition of the inner space is not limited thereto and may be changed. For example, the inner space may be a space formed by a virtual via hole formed by extension to a surface of the front electrode 141 and a surface of the front electrode current collector 142 through the substrate 110.

Examples of the various shapes of the portion of the front electrode 141 and/or the portion of the front electrode current collector 142 in the inner space of each of the via holes 181 will be described below. For example, as shown in a first example in FIG. 2, the front electrode current collector 142 completely fills in a portion of the inner space of the via hole 181 located towards the rear surface, and the front electrode 141 is applied only on a side wall of the remaining portion of the inner space of the via hole 181 located towards the front surface, to thereby connect the front electrode 141 and the front electrode current collector 142 into the via hole 181. Accordingly, in the first example of FIG. 2, the front electrode 141 includes a cavity.

In a second example in FIG. 2, the front electrode 141 incompletely fills in the major portion of the inner space of the via hole 181 located towards the front surface, and the front electrode current collector 142 completely fills in the remaining portion of the inner space of the via hole 181 located towards the rear surface. Accordingly, in the second example of FIG. 2, both the front electrode 141 and the front electrode current collector 142 do not include a cavity.

In addition, as shown in FIG. 3, each front electrode 141 is electrically and physically connected to the corresponding front electrode current collector 142, and the front electrode 141 and/or the front electrode current collector 142 may completely fill in a portion of the inner space of the via hole 181 and/or may contain a cavity.

That is, referring to (a) of FIG. 3, in contrast to the first example of FIG. 2, the front electrode 141 completely fills in a portion of the inner space of the via hole 181 located towards the front surface, and the front electrode current collector 142 is applied on a side wall of the remaining portion of the inner space of the via hole 181 located towards rear surface, to connect the front electrode 141 and the front electrode current collector 142, As shown in (b) of FIG. 3, in contrast to the second example of FIG. 2, the front electrode current collector 142 completely fills in the major portion of the inner space of the via hole 181 located towards the rear surface, and the front electrode 141 completely fills in the remaining portion of the inner space of the via hole 181 located towards the front surface.

In addition, as shown in (c) and (d) of FIG. 3, the first charge transfer unit 140 is applied on only a side wall of the via hole 181 to a predetermined thickness. At this time, in an inner space of the via hole 181, a height h1 of the front electrode 141 may be greater than a height h2 of the front electrode current collector 142 [(c) of FIG. 3], or a height h1 of the front electrode 141 may be less than a height h2 of the front electrode current collector 142 [(d) of FIG. 3]. In an embodiment of the invention, the heights h1 and h2 of the front electrode 141 and the front electrode current collector 142 may be equal to each other in the inner space of the via hole 181. In this embodiment, the heights h1 and h2 of the front electrode 141 and the front electrode current collector 142 designate distances from the virtual upper surface S1 and the virtual lower surface S2 to portions which the front electrode 141 is in contact with the front electrode current collector 142 in the via hole 181, respectively, but it is not limited thereto. Further, as shown in (c) and (d) of FIG. 3, portions of the front electrode 141 and the front electrode current collector 142 in the via hole 181 each have cavities or grooves 188, 189. The respective cavities 188, 189 of the front electrode 141 and the front electrode current collector 142 in the via hole 181 may be connected. Additionally, although (c) and (d) of FIG. 3 show respective cavities 188, 189 being exposed at respective front and rear surfaces, the respective cavities 188, 189 need not be exposed at the respective front and rear surfaces, and may be entirely enclosed within the via hole 181 by the front electrode 141 and the front electrode current collector 142. Further, the respective cavities 188, 189 may be enclosed and be joined so that the respective cavities 188, 189 form a single enclosed cavity within the via hole 181.

Since the examples of FIGS. 2 and 3 show various shapes of portions of the front electrode 141 and the front electrode current collector 142 in the inner space of each via hole 181, in other embodiments, other shapes for the at least one of the front electrode 141 and the front electrode current collector 142 may exist in the via hole 181.

As described above, at least one of the front electrode 141 and the front electrode current collector 142 positioned on portions on which each via hole 181 is formed may have at least one groove 188 and 189. A diameter d1 or d2 of each groove (or cavity) 188 or 189 is varied in accordance with each thickness of the front electrode 141 and the front electrode current collector 142 applied on the side wall of the each via hole 181. In this embodiment, the diameters d1 and d2 of the grooves 188 and 189 are diameters of entrances of the grooves 188 and 189 at their respective surfaces, respectively, but are not limited thereto. As shown in FIG. 3, the diameters d1 and d2 of the grooves 188 and 189 need not be constant, and may be varied based on positions in the grooves 188 and 189.

In addition, a depth of each groove 188 and 189 is changed based on the shape of the front electrode 141 and/or the front electrode current collector 142 in the inner space of each via hole 181, and thereby the grooves 188 and 189 formed on the first charge transfer units 140 have at least two depths of different magnitudes from each other, respectively. Accordingly, when the front electrodes 141 and the front electrode current collectors 142 are physically and electrically connected into the inner spaces of the via holes 181, connection conditions of the front electrodes 141 and the front electrode current collectors 142 into the via holes 181 influence flows of charges flowing from the front electrodes 141 to the front electrode current collectors 142, and thereby the connection conditions influence resistances of serial resistors formed between the front electrodes 141 and the front electrode current collectors 142.

In the solar cell 1, the maximum output current of the solar cell 1 is defined depending on the resistances of the serial resistors. For example, as the resistances of the serial resistors increase, the maximum output current decreases. Thus, when the resistances of the serial resistors enlarge, a value of a fill factor FF, which functions as an importance parameter in an efficiency of the solar cell 1, decrease, to reduce the efficiency of the solar cell 1. The fill factor FF has a value between 0 to 1.

The resistances of the serial resistors formed between the front electrodes 141 and the front electrode current collectors 142 are varied in accordance with thicknesses, that is, applied thicknesses (amounts) and contact areas of the front electrodes 141 and the front electrode current collectors 142 in the inner spaces of the via holes 181, respectively. That is, as a sectional area in proportion to the thickness of the front electrode 141 and the front electrode current collector 142 existing in the inner space (or surface of the inner space) of each via hole 181 increases, and the contact area of the front electrode 141 and the front electrode current collector 142 with respect to each other while in the inner space of each via hole 181 increases, the resistances of the serial resistors decrease. At this time, the contact areas of the front electrodes 141 and the front electrode current collectors 142 increase as the applied thicknesses of the front electrodes 141 and the front electrode current collectors 142 in the inner spaces (or the surfaces of inner space) of the via holes 181 increase.

As a result, as the sectional areas of the front electrode 141 and the front electrode current collector 142 existing in the inner spaces of the via holes 181 increase, the serial resistances decreases, and it is understood that a reduction of the fill factor FF due to the increment of the serial resistances lessens.

Figure 4:
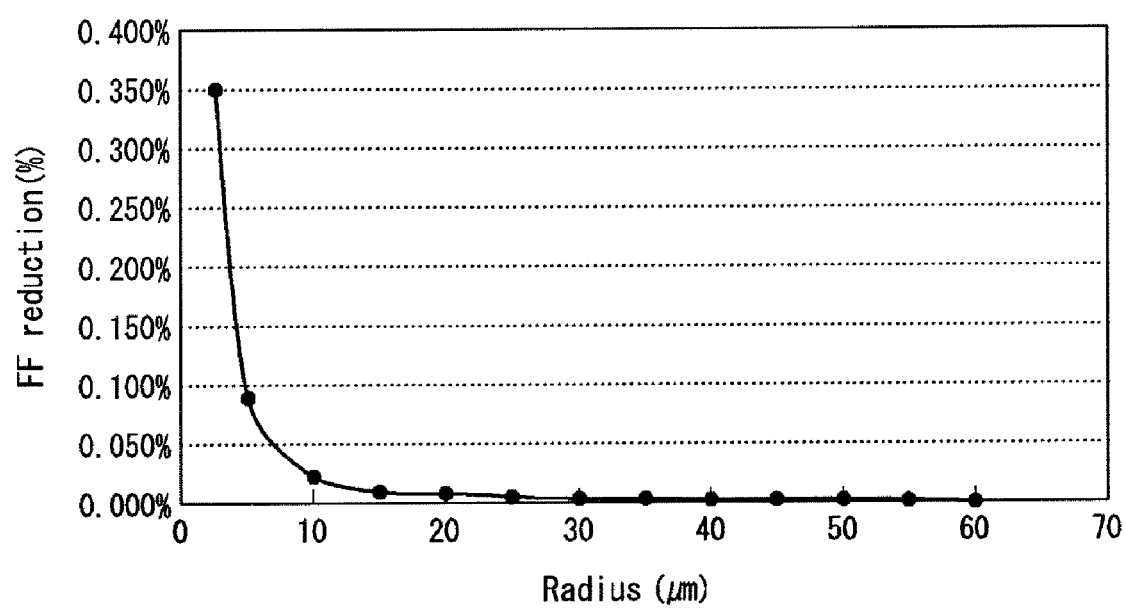
FIG. 4 shows a graph representing a reduction of a fill factor with respect to a radius of a via hole according to an example embodiment of the present invention.
Figure 6:
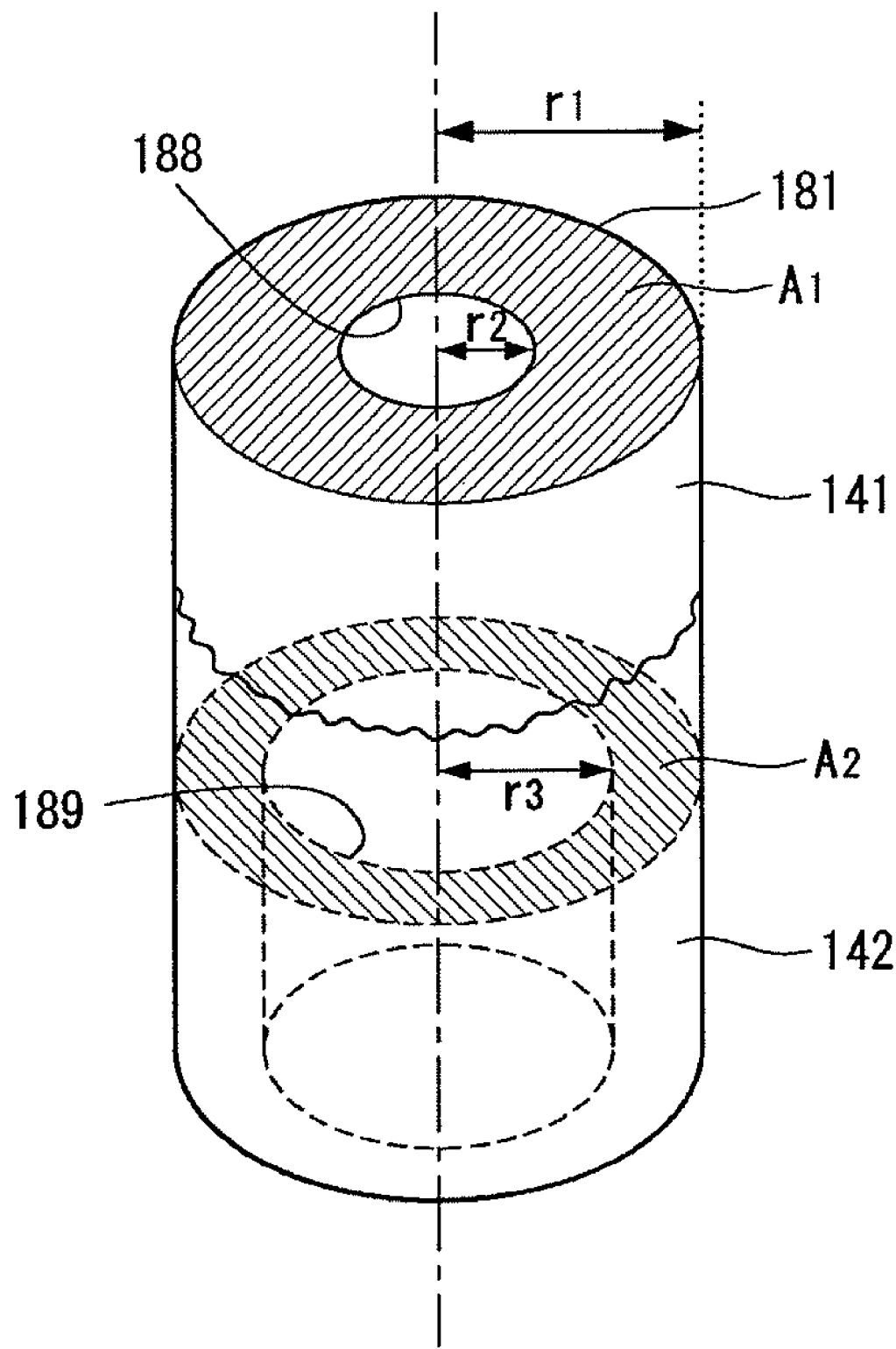
FIG. 6 shows an example of a method for calculating a sectional area of a first charge transfer unit in an inner space of a via hole according to an example embodiment of the present invention.

Next, referring to FIGS. 4 to 6, a relation of the sectional area of the first charge transfer unit 140 existing in the inner space of the via hole 181 and the variation of the fill factor FF will described. FIG. 4 show a graph representing a reduction of a fill factor FF with respect to a variation of a radius of a via hole according to an example embodiment of the present invention, FIG. 5 shows a table numerically expressing the graph of FIG. 4, and FIG. 6 shows an example of a method for calculating a sectional area of a first charge transfer unit in an inner space of a via hole according to an example embodiment of the present invention.

FIG. 4 show a reduction of a fill factor FF that occurs with respect to an increase of a radius of a via hole 181 when the inner spaces of the via holes 181 of various radiuses are almost entirely filled with the first charge transfer units (i.e., the front electrode 141 and/or the front electrode current collector 142), and FIG. 5 shows changes in sectional areas of the first charge transfer units existing in the inner spaces of the via holes that occur with respect to the various radiuses, in conjunction with the change in the radiuses of the via holes and the reductions of the fill factor FF of FIG. 4.

As shown in FIG. 6, a sectional area of the first charge transfer unit in the inner space is calculated by using a radius $r_1$ of the via hole 181 and a radius $r_2$ of a groove (or cavity) 188 formed where the first charge transfer unit does not fill the via hole 181. For example, in FIG. 6, a sectional area A1 of a front electrode 141 of the first charge transfer unit in the inner space of the via hole 181 is $(\pi r_1^2 - \pi r_2^2)$.

A sectional area A2 of a front electrode current collector 142 of the first charge transfer unit in the inner space of the via hole 181 is calculated in the same manner as the sectional area A1 of the front electrode 141. However, in FIG. 6, since a radius $r_3$ of a groove (or cavity) 188 formed where the first electrode current collector does not fill the via hole 181 is different from the radius $r_2$ of the groove 188, the sectional area A2 of the front electrode current collector 142 is also different from the sectional area A1 of the front electrode 141.

As described above, since shapes of the front electrode 141 and the front electrode current collector 142 in the inner space of the via hole 181 differ from each other, the respective sectional areas A1 and A2 of the front electrode 141 and the front electrode current collector 142 in the inner space of the same via hole 181 are also varied depending on their positions in the inner space.

Next, again referring to FIG. 5, when the sectional area A1 or A2 of the first charge transfer unit (for example, the front electrode 141 or the front electrode current collector 142) in the inner space of each via hole 181 is calculated, the variation of the fill factor FF with respect to the first charge transfer unit will be as discussed below.

Referring to FIG. 5, when the sectional area of the first charge transfer unit is about 314.2 $\mu m^2$, the reduction of the fill factor FF is about 0.02194%. Accordingly, it is understood that when the sectional area of the first charge transfer unit is about 310 $\mu m^2$, the reduction of the fill factor FF is low, and is basically about 0%. Accordingly, when the sectional area of the first charge transfer unit becomes more than about 300 $\mu m^2$, it can be seen that the serial resistance between the front electrode 141 and the front electrode current collector 142 in the inner space of the via hole 181 did not cause a significant reduction in the fill factor FF.

Accordingly, in this embodiment, to reduce or prevent the reduction of the fill factor FF due to the serial resistances between the front electrodes 141 and the front electrode current collectors 142 in the inner spaces of the via holes 181, the sectional areas of the first charge transfer units, that is, at least one of the front electrodes 141 and the front electrode current collectors 142, is about 300 $\mu m^2$ or more. In addition, as described above, since, when the radius of the via hole 181 is about 10 $\mu m$, the sectional area of the front charge transfer unit existing in the inner space of the via hole 181 is about 300 $\mu m^2$, it can be seen that the radius of each via hole 181 that provides the sectional area of the front charge transfer unit of about 300 $\mu m^2$ is about 10 $\mu m$. Thereby, since the reduction of the fill factor FF due to the first charge transfer units in the inner spaces of the via holes 181 does not occur for radiuses about 10 $\mu m$ or greater, and the sectional area of the front charge transfer unit of about 300 $\mu m^2$ or greater, the efficiency of the solar cell 1 is improved.

In FIG. 5, radiuses about 10 $\mu m$ to about 40 $\mu m$, and/or sectional areas of the front charge transfer unit of about 300 $\mu m^2$ to about 5000 $\mu m^2$ have good combinations of the size of the via hole not being too big or too small, have less reduction in the fill factor FF, and have the sectional area of the front charge transfer unit that provide less resistance. For example, the size of the via hole, as represented by the radius, should not be too small or too big, because a small via hole will be too hard to fill with front charge transfer units and a big via hole will decrease the area of the substrate to generate electron-hole pairs, leading to a decrease in the efficiency of the solar cell.

At least one BSF 171 is positioned between at least one rear electrode 151 and the substrate 110. The BSF 171 is an area (for example, a $p^+$-type area) that is more heavily doped with impurities of the same conductive type as the substrate 110 than the substrate 110.

The movement of electrons to the rear surface of the substrate 110 is disturbed by a potential barrier resulting from a difference between impurity doping concentrations of the substrate 110 and the BSF 171. Accordingly, the BSF 171 prevents or reduces a recombination and/or a disappearance of the electrons and holes in an interface of the substrate 110 and the rear electrode 151.

The solar cell 1 according to the embodiment having the above-described structure is a solar cell in which the front electrode current collectors 142 connected to the front electrodes 141 are positioned on the rear surface of the substrate 110 on which light is not incident. An operation of the solar cell 1 will be below described in detail.

When light irradiated to the solar cell 1 is incident on the substrate 110 through the emitter layer 120, a plurality of electron-hole pairs are generated in the substrate 110 by light energy based on the incident light. Because the surface of the substrate 110 is a textured surface, a light reflectance in the front surface of the substrate 110 is reduced. Further, because both a light incident operation and a light reflection operation are performed on the textured surface, a light absorptance is increased, and thereby the efficiency of the solar cell 1 is improved. In addition, because a reflection loss of light incident on the substrate 110 is reduced by the anti-reflection layer 130, an amount of light incident on the substrate 110 is further increased.

The electron-hole pairs are separated by the p-n junction of the substrate 110 and the emitter layer 120, and the separated electrons move to the n-type emitter layer 120 and the separated holes move to the p-type substrate 110. The electrons moving to the n-type emitter layer 120 are collected by the front electrodes 141 and then are transferred to the front electrode current collectors 142. The holes moving to the p-type substrate 110 are collected by the rear electrode 151 through the BSF 171, and then are transferred to the rear electrode current collectors 152. When the front electrode current collectors 142 are connected to the rear electrode current collectors 152 using electric wires, current flows therein to thereby enable use of the current for electric power.

At this time, the sectional areas of the front electrodes 141 and the front electrode current collectors 142 existing in the via holes 181 are about 300 μm² or more, which does not cause the reduction of the fill factor FF, respectively, and the efficiency of the solar cell 1 is further improved.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A solar cell, comprising:
    a substrate of a first conductive type having a plurality of via holes, the plurality of via holes penetrating the substrate;
    an emitter layer of a second conductive type opposite to the first conductive type; and
    a plurality of first electrodes positioned from a first surface of the substrate to the plurality of via holes and being in contact with the emitter layer; and
    a plurality of first electrode current collectors positioned from the plurality of via holes to a second surface of the substrate opposite the first surface,
    wherein the plurality of via holes are positioned on a portion of the substrate on which the plurality of first electrodes and the plurality of first electrode current collectors cross and at least one of the plurality of first electrodes and at least one of the plurality of first electrode current collectors are positioned in at least one via hole of the plurality of via holes, and
    wherein two cavities that are depressed into the plurality of via holes are positioned at crossed portions of the plurality of first electrodes and the plurality of via holes or at crossed portions of the plurality of first electrode current collectors and the plurality of via holes, and the two cavities have different diameters from each other.

2. The solar cell of claim 1, wherein the at least one of the at least one first electrode and the at least one electrode current collector in the at least one via hole has a sectional area of about 300 μm² or more.

3. The solar cell of claim 2, wherein the at least one first electrode and the at least one first electrode current collector are electrically connected to each other in the at least one via hole.

4. The solar cell of claim 1, wherein the two cavities are exposed to at least one of the first surface and the second surface of the substrate.

5. The solar cell of claim 1, wherein the at least one first electrode and the at least one first electrode current collector comprises the two cavities at the crossed portions of the plurality of first electrodes and the plurality of via holes and at the crossed portions of the plurality of first electrode current collectors, respectively, and one of the two cavities of included in the at least one first electrode has a different diameter from one of the two cavities included in the at least one first electrode current collector.

6. The solar cell of claim 1, wherein the first surface of the substrate is an incident surface and the second surface of the substrate is positioned on a side opposite to the first surface.

7. The solar cell of claim 1, further comprising:
    a second electrode positioned on the second surface and electrically connected to the substrate.

8. The solar cell of claim 1, wherein each of the plurality of via holes has a radius of about 10 μm to about 40 μm.

9. The solar cell of claim 7, further comprising at least one second electrode current collector positioned on the second surface to be connected to the second electrode, and separated from the at least one first electrode current collector.

* * * * *